June 18, 1957 S. OFFERMAN 2,796,593

SOCKET FOR A PRINTED CIRCUIT

Filed April 27, 1956

INVENTOR.
SEYMOUR OFFERMAN

BY James and Franklin

ATTORNEYS

United States Patent Office
2,796,593
Patented June 18, 1957

2,796,593

SOCKET FOR A PRINTED CIRCUIT

Seymour Offerman, Great Neck, N. Y., assignor to Industrial Hardware Manufacturing Co., Inc., New York, N. Y., a corporation of New York Application August 27, 1956, Serial No. 606,502
15 Claims. (Cl. 339—220)

This invention relates to sockets for receiving multiple pin connectors, and more particularly for receiving vacuum tubes.

Printed circuitry is sometimes printed on the side carrying the components, this being called "copper up," and sometimes on the side opposite the components, this being called "copper down." Because the tube sockets must make contact with the printed circuit lines, a different socket has been required for boards printed copper up, and those printed copper down. One primary object of the present invention is to provide a single socket which may be used with boards printed either copper up or copper down.

Viewed in a different aspect, a primary object of the present invention is to provide a socket so designed that it will receive a vacuum tube from either side of the socket. Indeed, when using the present socket it would be possible to mount some tubes on one side of the board and some on the other side, if for any reason that unusual arrangement were desired.

The socket comprises an insulation base and metal contacts, and the insulation base is preferably a molded base. The contacts are added later, and in accordance with a further feature and object of the present invention the contacts are secured in position subsequently yet firmly, comparable to contacts molded in place, but with the added advantage of self adjustability of the contacts.

To accomplish the foregoing general objects, and other more specific objects which will hereinafter appear, my invention resides in the socket elements and their relation one to another as are hereinafter more particularly described in the following specification. The specification is accompanied by a drawing in which.

Figures 1, 2, 3, 4, 5, 6, 7, 8, 9, 10, 11, 12, 13:
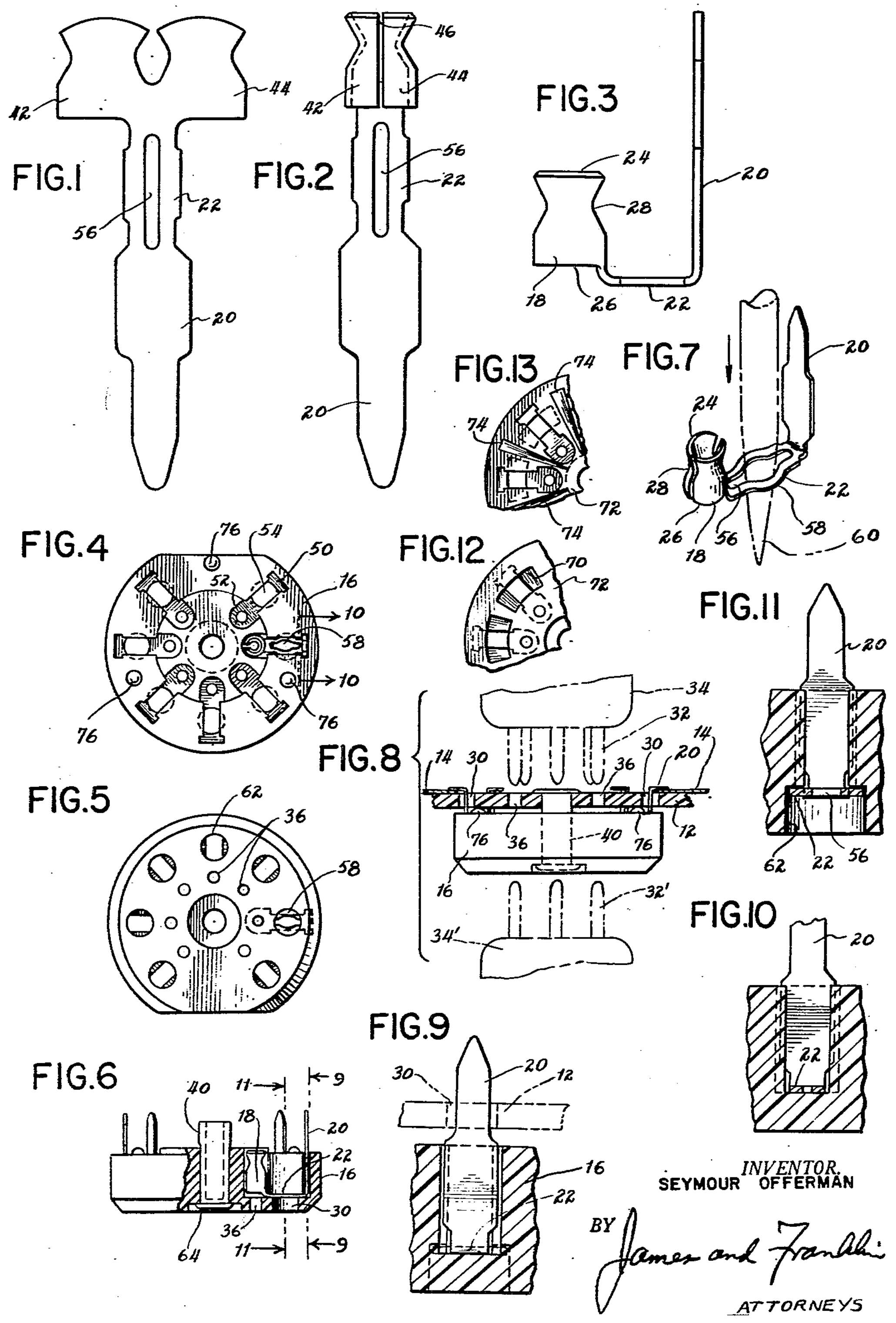
Fig. 1 shows a sheet metal blank from which a single contact is formed.
Fig. 2 shows the blank with one end formed into a split sleeve to act as a pin grip.
Fig. 3 is a side elevation of the finished contact.
Fig. 4 shows one side of the insulation base, with one contact inserted therein.
Fig. 5 shows the other side of the base.
Fig. 6 is a partially sectioned elevation of a completed socket.
Fig. 7 is a fragmentary perspective view showing a step in the attachment of the contacts to the base.
Fig. 8 is a partially sectioned elevation showing how the socket may be used with a printed circuit board.
Fig. 9 is an enlarged fragmentary section taken approximately in the plane of the line 9—9 of Fig. 6.
Fig. 10 is a fragmentary section taken approximately in the plane of the line 10—10 of Fig. 4.
Fig. 11 is a section taken approximately in the plane of the line 11—11 of Fig. 6.
Fig. 12 is a fragmentary view similar to a part of Fig. 5, but showing a modification.
Fig. 13 is a fragmentary view similar to a part of Fig. 4, but showing the modification of Fig. 12.

Referring to the drawing, and more particularly to

Fig. 8, I there show a printed circuit board 12 having circuitry 14 printed on its upper surface. The socket comprises an insulation base 16, and metal contacts which are concealed in Fig. 8 but well shown in Figs. 3 and 7. Each metal contact comprises a pin grip 18, a tail 20, and a bridge 22 connecting the pin grip and tail. The pin grip 18 is of the split sleeve type, and is enlarged at both ends 24 and 26, and convergent therebetween, as is indicated by the necked intermediate portion 28.

Reverting now to Fig. 8, the contacts are not visible except for the ends of the tails 20, which are received through a ring of mating holes 30, and which are bent over as shown, both to help physically anchor the socket in position, and to help electrically contact the printed circuit lines 14. The pins 32 of a vacuum tube 34 are usually disposed on a circle, and the holes 30 are also disposed on a circle, but of larger radius. The particular socket here shown is intended for use with the so-called "miniature" tube, and it ordinarily has seven pins at the spacing of eight, although in some cases there are eight pins at the spacing of nine.

The printed circuit board 12 is provided with a ring of holes 36 which are in alignment with the pins 32 of tube 34, and with the pin grips of the socket. The insulation base 16 has a thickness which is only a fraction of its diameter, and the dimensioning of the parts is such that the pins 32 are received by the pin grips of the socket, even though the socket is disposed beneath the printed circuit board.

As will later appear, the base 16 provides open access to either end of the pin grips, and consequently a vacuum tube 34' having pins 32' could be inserted into the socket 16 in opposite direction. Thus if the board 12 had been prepared copper down instead of copper up, the socket would be located on the side opposite the printed circuitry, that is, on top of the board. Indeed, such is the more common arrangement, but Fig. 8 and the other figures of the drawing show the socket in what might be considered its inverted position, because that emphasizes the unusual nature of the present socket.

The main physical attachment of the socket 16 to the board 12 is by means of a special fastener, in this case an eyelet 40. The main electrical connection is by means of solder over the bent tail ends and the printed circuit lines.

Referring now to Figs. 1, 2 and 3, the particular contact here used is formed from a blank having the configuration shown in Fig. 1. The parts 42 and 44 make up the pin grip, while the bridge is shown at 22, and the tail at 20. In Fig. 2 the parts 42 and 44 have been bent around toward one another until the remote edges almost meet at 46. This provides a pin grip which is split at diametrically opposite points, so that the pin is gripped with a resilient fit. The pin grip and the tail are then bent to positions substantially perpendicular to the bridge 22, as shown in Fig. 3.

Referring now to Fig. 4, the insulation base 16 has a series of elongated recessed pockets, one for each contact. The end part 50 of each pocket is dimensioned to receive the enlarged or wider part of the tail 20 (Fig. 1). The inner end 52 of the pocket is dimensioned to receive the pin grip. The intermediate part 54 is somewhat narrower and is dimensioned to receive the bridge 22 when the latter is in unspread condition, as shown in Figs. 1 and 2.

Reverting to those figures, it will be noted that the bridge 22 is slotted or slit longitudinally, as indicated at 56. This facilitates spreading of the bridge, as shown at 58 in Fig. 7. The bridge may be spread by driving in a suitable preferably sharply pointed tool or punch 60 through the slit 56.

Referring now to Fig. 5 of the drawing, the socket base when viewed on what would normally be considered the top of the socket, has the ring of holes 36 suitably located to receive the vacuum tube pins. There is another ring of larger holes 62 which register with the approximate mid-points of the bridges of the contacts. The diameter of the holes 62 is greater than the width of the bridges, and the width of the parts 54 (Fig. 4) of the pockets which receive the contacts, and this difference in dimension is visible in Fig. 5, that is, the holes 62 are partially blind holes.

The depth of the apertures 62 is large enough to pass the bottom of the elongated pockets. In other words, the pockets formed in one face and the apertures formed in the opposite face overlap in depth, and their overlap preferably is made at least slightly greater than the thickness of the sheet metal used for the contacts. Thus it may be said that the side walls of the pockets are recessed or expanded somewhat, intermediate their ends, to a dimension defined by the diameter of the partially blind apertures 62.

Reverting now to Fig. 4, after a contact has been inserted in its receptive pocket, the bridge portion may be spread as shown at 58, thus causing the spread bridge to enter the recesses in the sides of the pocket. More specifically, the contact is held against movement in one direction by the bottom of the pocket, and it is held against movement in opposite direction by the bottom of the aperture. Thus the contact is securely anchored in position, yet is self-adjustably movable to fit the pins of the vacuum tube. Eventually the tails are soldered, but these are far from the pin grips, and do not prevent movement at the pin grips.

Fig. 10 shows the relation of the bridge to the pocket near the ends of the bridge. Fig. 11 shows the relation of the spread bridge to both the aperture 62 and the pocket at the middle of the bridge. In Fig 10 the contact cannot move appreciably down. In Fig. 11 it cannot move appreciably up. Thus the contact is anchored within the insulation base. There is clearance for self-adjustable bodily movement of the contact in sideward direction.

Although Figs. 4 and 5 show a single contact inserted and spread in position, it will be understood that in practice the base may be loaded with all of the contacts, following which they all may be simultaneously spread, as by using a tool having seven sharply tapered spreader pins like the pin 60 shown in Fig. 7. The pins move in the direction shown by the arrow in Fig. 7.

Referring now to Fig. 6, the completed socket is provided with an eyelet 40, headed at 64. The tails 20 at this time are straight. Fig. 9 shows how the wide portion of the tail is received in the insulation base 16 of the socket, while the narrowed end portion of the tail is received in the printed circuit board 12. The change resulting from spreading of the bridge 22 is indicated at each side of the bottom of the tail in Fig. 9 (as well as in Fig. 11).

Fig. 12 is a fragmentary view similar to a part of Fig. 5, but showing a modification in which the apertures 70 are approximately rectangular, instead of being cylindrical as shown at 62 in Fig. 5. Actually, the apertures 70 are not truly rectangular, and are defined by radial lines at the ends, and arcs at the sides, but the important thing is that their dimension in a direction transverse to the pocket (shown in dotted lines because it is on the other side of the base) is greater than the width of said pocket. Also, as previously described, the depth of aperture 70 overlaps the depth of the pocket, thus providing the side recesses into which the sides of the bridge later are spread. To simplify the drawing the metal contacts are omitted.

As before, the contacts are held against movement in one direction out of the base by the bottom of the pocket on one side, and are held against movement in opposite direction out of the base by the bottom of the aperture on the other side.

This modified socket differs in another respect, shown in Fig. 13, which corresponds to a part of Fig. 4, and which illustrates the opposite side of the modified base 72 shown in Fig. 12. In Fig. 13, the pockets are like those shown in Fig. 4, but radial projections or ribs 74 are provided between the pockets. Later, these raised projections rest against the printed circuit board. In that respect, they correspond to the three spaced projections or teats 76 shown in Fig. 4. These bear against the printed circuit board as shown in Fig. 8. In the modification of Fig. 13, the teats 76 are replaced by radial ridges 74, there being one such ridge between each two adjacent contacts. They have the advantage of adding slightly to the insulation barrier between the adjacent contacts.

It is believed that the construction and method of use of my improved socket, as well as the advantages thereof, will be apparent from the foregoing detailed description. A vacuum tube may be inserted in the socket from either side of the socket, so that the socket may be used with either side uppermost. In the case of printed circuits, the same socket may be used, whether the board has been printed copper down or copper up. The insulation base of the socket may be a molded base, with the contacts added later, yet the contacts are strongly secured in the base, and are free for self-adjustable movement.

It will be apparent that while I have shown and described my invention in several preferred forms, many changes may be made without departing from the scope of the invention, as sought to be defined in the following claims.

I claim:

1. A socket having a molded insulation base with metal contacts, each contact being formed of sheet metal shaped to provide a pin grip, a tail, and a bridge connecting the pin grip and tail, said bridge being longitudinally slit and spread laterally in the plane of the bridge, said base having pockets dimensioned to receive the contacts including the bridge in unspread condition, the edges of the spread bridge being received in recesses in the adjacent side walls of the pocket receiving the same and thereby locking the contact in the base.

2. A socket having a generally circular molded insulation base with a ring of metal contacts, each contact being formed of sheet metal shaped to provide a pin grip, a tail, and a bridge connecting the pin grip and tail, said bridge being disposed radially of the base and being longitudinally slit and spread, said base having pockets dimensioned to receive the contacts including the bridge in unspread condition, the edges of the spread bridge being received in recesses in the adjacent side walls of the pocket receiving the same and thereby locking the contact in the base, the pin grips being disposed on an inner circle and said tails being disposed on an outer circle.

3. In the manufacture of a socket having a molded insulation base with metal contacts, each contact being shaped to provide a pin grip, a tail and a slit spreadable bridge connecting the pin grip and the tail, the method which includes molding the base without the contacts, but with pockets dimensioned to receive the contacts including the bridge in unspread condition, inserting the contacts in the pockets, and thereafter spreading the slit and the bridge laterally in the plane of the bridge in order to cause the side edges of the bridge to expand into recesses in the adjacent side walls of the pocket of the base and thereby locking the contact in the base.

4. In the manufacture of a socket having a molded insulation base with metal contacts, each contact being shaped to provide a pin grip, a tail, and a slit spreadable bridge connecting the pin grip and the tail, the method of manufacture, which includes molding the base without the contacts, forming elongated pockets on one side dimensioned to receive the contacts, including the bridge in unspread condition, forming apertures on the other side registering with the pockets and larger than the width of the pockets and to a depth somewhat overlapping the pockets, inserting the contacts in the pockets, and thereafter spreading the slit of the bridge in order to cause the side edges of the bridge to expand into recesses in the adjacent side walls of the overlapped pocket and aperture of the base in order to lock the contact in the base.

5. A socket comprising an insulation base and metal contacts, each of said contacts including a pin grip portion, said pin grip portion being of the split sleeve type and being widely open at both ends and convergent therebetween, whereby it is adapted to receive a vacuum tube pin in either direction, said insulation base having a thickness which is only a fraction of its diameter and having apertures which expose both ends of the pin grip portions, whereby the socket is adapted to receive a vacuum tube from either side.

6. A socket comprising a generally circular insulation base and a ring of metal contacts, each of said contacts including a pin grip portion, said pin grip portion being of the split sleeve type and being widely open at both ends and convergent therebetween, whereby it is adapted to receive a vacuum tube pin in either direction, said insulation base being generally flat and having a thickness which is only a fraction of its diameter and having apertures which expose both ends of the pin grip portions, whereby the socket is adapted to receive a vacuum tube from either side.

7. A vacuum tube socket designed for use with printed circuitry, said socket comprising a molded insulation base the thickness of which is only a fraction of its diameter, metal contacts each comprising a pin grip, a tail, and a bridge connecting same, said tails being dimensioned to be received through holes in a printed circuit board and to be bent against printed circuit lines, said pin grips being of the split sleeve type and being enlarged at both ends and convergent therebetween, the arrangement and dimensioning of the parts being such that the socket is adapted to receive a vacuum tube from either side, whereby it may be used on a printed circuit board whether printed copper up or copper down.

8. A vacuum tube socket designed for use with printed circuitry, said socket comprising a generally circular molded insulation base the thickness of which is only a fraction of its diameter, a ring of metal contacts each comprising a pin grip, a tail, and a bridge connecting same, the bridges being disposed radially with the pin grips on an inner circle and the tails on an outer circle, said tails being dimensioned to be received through a ring of holes in a printed circuit board and to be bent outward against printed circuit lines, said pin grips being of the split sleeve type and being enlarged at both ends and convergent therebetween, the arrangement and dimensioning of the parts being such that the socket is adapted to receive a vacuum tube from either side, whereby it may be used on a printed circuit board whether printed copper up or copper down.

9. A socket having a molded insulation base with metal contacts, each contact including a bridge which is longitudinally slit, said base having elongated pockets dimensioned to receive the contacts in unspread condition, and having apertures on the opposite side of the base registering with the pockets and larger in a direction transverse to the pockets than the width of the pockets, said apertures being formed to a depth overlapping the depth of the pockets an amount exceeding the thickness of the bridge, said split bridge being disposed in said pocket and being spread to enter the adjacent side walls of the pocket where the said walls are enlarged by the aperture, thereby locking the contact in the base between the bottom of the pocket on one side and the bottom of the aperture on the other side.

10. A socket having a molded insulation base with metal contacts, each contact being formed of sheet metal shaped to provide a pin grip, a tail, and a bridge connecting the pin grip and the tail, said bridge being longitudinally slit, said base having elongated pockets dimensioned to receive the contacts in unspread condition, and having apertures on the opposite side of the base registering with the pockets and larger in a direction transverse to the pockets than the width of the pockets, said apertures being formed to a depth overlapping the depth of the pockets an amount exceeding the thickness of the bridge, said split bridge being disposed in said pocket and being spread to enter the adjacent side walls of the pocket where the said walls are enlarged by the aperture, thereby locking the contact in the base between the bottom of the pocket on one side and the bottom of the aperture on the other side.

11. A socket having a generally circular molded insulation base with a ring of metal contacts, each contact being formed of sheet metal shaped to provide a pin grip, a tail, and a bridge connecting the pin grip and the tail, said bridge being disposed radially of the base and being longitudinally slit, said base having elongated pockets dimensioned to receive the contacts in unspread condition, and having apertures on the opposite side of the base registering with the pockets and larger in a direction transverse to the pockets than the width of the pockets, said apertures being formed to a depth overlapping the depth of the pockets an amount exceeding the thickness of the bridge, said split bridge being disposed radially of the base in said pocket and being spread to enter the adjacent side walls of the pocket where the said walls are enlarged by the aperture, thereby locking the contact in the base between the bottom of the pocket on one side and the bottom of the aperture on the other side, the pin grips being disposed on an inner circle, and said tails being disposed on an outer circle of larger diameter.

12. A socket comprising a molded insulation base and metal contacts, each of said contacts including a pin grip portion and a bridge portion which is longitudinally slit, said pin grip portion being of the split sleeve type and being widely open at both ends and convergent therebetween, whereby it is adapted to receive a vacuum tube pin in either direction, said base having elongated pockets dimensioned to receive the bridge portions in unspread condition, and having apertures on the opposite side of the base registering with the pockets and larger in a direction transverse to the pockets than the width of the pockets, said apertures being formed to a depth overlapping the depth of the pockets an amount exceeding the thickness of the bridge, said split bridge being disposed in said pocket and being spread to enter the adjacent side walls of the pocket where the said walls are enlarged by the aperture, thereby locking the contact in the base between the bottom of the pocket on one side and the bottom of the aperture on the other side, said insulation base having a thickness which is only a fraction of its diameter, and having apertures which receive the pin grip portions and which expose both ends of the pin grip portions, whereby the socket is adapted to receive a vacuum tube from either side of the socket.

13. A socket comprising a molded insulation base and metal contacts, each contact being formed of sheet metal shaped to provide a pin grip, a tail, and a bridge connecting the pin grip and tail, said pin grip being of the split sleeve type and being widely open at both ends and convergent therebetween, whereby it is adapted to receive a vacuum tube pin in either direction, said insulation base having a thickness which is only a fraction of its diameter and having apertures which expose both ends of the pin grips, whereby the socket is adapted to receive a vacuum tube from either side, said bridge being longitudinally slit and spread laterally in the plane of the bridge, said base having pockets dimensioned to receive the contacts including the bridge in unspread condition, the edges of the spread bridge being received in recesses in the adjacent side walls of the pocket receiving the same and thereby locking the contact in the base.

14. A socket comprising a generally circular molded insulation base and a ring of metal contacts, each contact being formed of sheet metal shaped to provide a pin grip, a tail, and a bridge connecting the pin grip and the tail, said pin grip being of the split sleeve type and being widely open at both ends and convergent therebetween, whereby it is adapted to receive a vacuum tube pin in either direction, said insulation base being generally flat and having a thickness which is only a fraction of its diameter and having apertures which expose both ends of the pin grips, whereby the socket is adapted to receive a vacuum tube from either side, said bridge being longitudinally slit, said base having elongated pockets dimensioned to receive the contacts in unspread condition, and having apertures on the opposite side of the base registering with the pockets and larger in a direction transverse to the pockets than the width of the pockets, said apertures being formed to a depth overlapping the depth of the pockets an amount exceeding the thickness of the bridge, said split bridge being disposed in said pocket and being spread to enter the adjacent side walls of the pocket where the said walls are enlarged by the aperture, thereby locking the contact in the base between the bottom of the pocket on one side and the bottom of the aperture on the other side.

15. A vacuum tube socket designed for use with printed circuitry, said socket comprising a generally circular molded insulation base the thickness of which is only a fraction of its diameter, a ring of metal contacts each comprising a pin grip, a tail, and a bridge connecting same, the bridges being disposed radially with the pin grips on an inner circle and the tails on an outer circle of larger diameter, said tails being dimensioned to be received through a ring of holes in a printed circuit board and to be bent outward against printed circuit lines, said pin grips being of the split sleeve type and being enlarged at both ends and convergent therebetween, the arrangement and dimensioning of the parts being such that the socket is adapted to receive a vacuum tube from either side, whereby it may be used on a printed circuit board whether printed copper up or copper down, said bridge being longitudinally slit, said base having elongated pockets dimensioned to receive the contacts in unspread condition, and having apertures on the opposite side of the base registering with the pockets and larger in a direction transverse to the pockets than the width of the pockets, said apertures being formed to a depth overlapping the depth of the pockets an amount exceeding the thickness of the bridge, said split bridge being disposed radially of the base in said pocket and being spread to enter the adjacent side walls of the pocket where the said walls are enlarged by the aperture, thereby locking the contact in the base between the bottom of the pocket on one side, and the bottom of the aperture on the other side.

References Cited in the file of this patent

UNITED STATES PATENTS

| | | |
|---|---|---|
| 799,748 | Mills | Sept. 19, 1905 |
| 2,039,957 | Hall | May 5, 1936 |
| 2,755,453 | Cloutier | July 17, 1956 |